United States Patent [19]

Oda

[11] Patent Number: 4,887,365
[45] Date of Patent: Dec. 19, 1989

[54] APPARATUS FOR CONTINUOUSLY DRYING COATING LAYER ON WEB

[75] Inventor: Kazutaka Oda, Shizuoka, Japan

[73] Assignee: Fuji Photo Film Co., Ltd., Kanagawa, Japan

[21] Appl. No.: 267,883

[22] Filed: Nov. 7, 1988

[30] Foreign Application Priority Data

Nov. 6, 1987 [JP]   Japan .................................. 62-279343

[51] Int. Cl.⁴ ............................................ F26B 19/00
[52] U.S. Cl. .......................................... 34/60; 34/159;
                                                  34/118; 68/5 D
[58] Field of Search .................... 34/161, 155, 159, 17,
            34/18, 60, 118; 68/5 C, 5 D; 8/149.2, 151

[56] References Cited

U.S. PATENT DOCUMENTS 1,035,218  8/1912  Meade .................................. 34/155
3,694,928  10/1972  Barta et al. ........................... 34/159

Primary Examiner—Henry A. Bennet
Assistant Examiner—John Sollecito
Attorney, Agent, or Firm—Sughrue, Mion, Zinn, Macpeak & Seas

[57] ABSTRACT

An apparatus for continuously drying a coating layer on a web includes a deflecting and heating roller which deflects the web having the coating and traveling continuously in a drying chamber. The deflecting and heating roller is disposed so as to be capable of varying its position for deflecting the web so that the length of the web to stay in the drying chamber can be varied and adjusted. Gas-flow supply means is provied for supplying a gas flow to the coating of the web traveling in the drying chamber.

12 Claims, 3 Drawing Sheets

APPARATUS FOR CONTINUOUSLY DRYING COATING LAYER ON WEB

BACKGROUND OF THE INVENTION

The present invention relates to an apparatus for drying a coating layer which is formed on the surface of a web or an elongated strip.

Techniques for applying a liquid layer to a traveling web and drying the applied liquid layer and indispensable to the manufacture of a colored steel sheet, a PS (presensitized) plate (a plate or sheet for lithographic-printing in which the material of a base plate such as aluminum, paper, plastic or the like is coated with a photosensitive solution), a photographic film, or the like. They are extensively utilized in industry and are the subject of extensive research and development. In particular, the PS plate is manufactured in such a manner that the front surface of a web of, e.g., aluminum traveling continuously is subjected to mechanical, chemical and electrochemical treatments so as to be formed to have a roughened surface, an anodic-oxided surface and a hydrophilic surface, that the resulting surface is coated with the solution of a photosensitive resin in an organic solvent, and that after the coating is dried, the web is cut into a finished product. The drying step is important as a process for forming photosensitive layers.

In an apparatus for drying of this type, it is generally required not only to vaporize the organic solvent but also to control the remaining amount of high-boiling components. The reason is that the amount of the residual solvent affects the strength of the layers and the developing aptitude thereof at the time of use. That is, improper drying conditions are the cause of unclean printing ascribable to poor development and low printing durability ascribable to inferior layer strength. Such conditions severely detract from the function of the PS plate.

When broadly divided, the drying step consists of two subordinate steps. In the first subordinate step, principally the concentration of the solution is raised with the vaporization of the solvent so as to produce a soft layer. At this stage, drying is usually controlled under a mild drying condition in order to suppress the occurrence of orange peel and brushing which are known to be the drying defects of organic solvents. The second subordinate step is a stage for hardening the layer, for which the control of the amount of residual solvent is important. At this stage, the vaporization of the solvent has its rate determined by the diffusion migration rate within the layer. The drying equipment is also divided in this manner into a part for the first subordinate step and a part for the second subordinate step, the drying conditions whereof differ. In some cases, the drying step is made up of three subordinate steps by setting an intermediate condition between the first and second subordinate steps. In the prior art, all the subordinate steps rely upon hot air drying, and the conditions are optimized by controlling the temperature, the humidity and the flow rate of air. In general, the temperature is gradually raised from the beginning. Also, in terms of the equipment, the shape of a blowout port or the like is contrived for the purposes of coping with wind marks at the initial stage of drying, enlarging the coefficient of heat transfer, etc.

A drying apparatus as shown in FIG. 2 is employed in the prior art to implement the drying step.

FIG. 2 is a schematic view of the prior-art drying apparatus. An aluminum web 1 which travels continuously while being guided by guide rollers R is coated with a liquid containing a solvent by an applicator 2, and is introduced into a first subordinate drying zone 3. The first subordinate-step drying zone 3 is provided with a gas inlet 5 and a gas outlet 6. A gas supplied through the gas inlet 5 is distributed by a distributing vane 9 to form a uniform gas flow and is brought into contact with the surface of the coating formed on the aluminum web 1 by the coating step, so as to dry the coating, whereafter it is discharged through the gas outlet 6. The coating of the aluminum web 1 having reached the vicinity of the exit of the first subordinate-step drying zone 3 presents a soft film state. Subsequently, the elongated aluminum web 1 which travels continuously while being guided by guide rollers R is introduced into a second subordinate-step drying zone 4. This drying zone 4 is provided with gas inlet 7 and a gas outlet 8. A high-temperature gas supplied through the gas inlet 7 is forcibly expelled from a slit-type nozzle 10 to come into strong contact with the coating surface of the aluminum web 1. Thus, the solvent remaining in the coating vaporizes away, and the coating hardens. The gas is discharged through the gas outlet 8 after having contacted the coating.

SUMMARY OF THE DISCLOSURE

There has recently been increased demand for production of various kinds of articles in small quantities, and changes in conditions are frequently made. With the prior-art drying apparatus, the changes are coped with by altering the drying temperatures. However, since the production line is stopped until the completion of a temperature change, a reduction in production efficiency occurs.

Moreover, in a case where the performance of the second subordinate-step drying whose rate is determined by the migration rate within the coating is to be enhanced in order to increase the production speed, the efficiency of heat transfer is low with hot-air drying and the equipment becomes inevitably large in size. In other words, the drying zone must be extended in length.

Accordingly, it is an object of the present invention to provide a drying apparatus of high efficiency while eliminates these disadvantages of the prior-art equipment. Other objects of the present invention will become apparent in the entire disclosure.

According to the present invention, the foregoing object is attained by providing an apparatus for continuously drying a coating on a web, comprising a drying chamber, a deflecting and heating roller for deflecting the web which has the coating and which travels continuously in the drying chamber, the deflecting and heating roller being variable in position for deflecting the web so that a length of the web to reside in the drying chamber is capable of being variably adjusted, and gas-flow supply means for supplying gas flow to the coating of the web traveling in the drying chamber.

More specifically, the drying apparatus of the present invention includes heat transfer means of high transfer efficiency, whereby changes in conditions can be made instantly, without stopping a production line, in conformity with production of various kinds of articles in small quantities, and whereby it is possible to deal with a rise in production speed.

In more detail, the drying apparatus of the present invention is capable of freely controlling the dried state of the coating of the web without changes in conditions, such as a temperature change in the gas flow in the drying chamber, that require a long period of time. Hence, many kinds of coating can be dried to desired states and the drying conditions of the apparatus can be promptly changed. Accordingly, the operating efficiency of the apparatus is not reduced even by the production of various kinds of articles in small quantities.

The drying apparatus of the present invention can provide substantially the same effect as expansion of the drying chamber without enlarging the size of the apparatus. This makes it possible to reduce the space needed for the drying step.

In addition, the drying apparatus of the present invention is capable of freely regulating the drying rate of the coating of the web and of coping with even the high production speed of, for example, a PS plate requiring a step for sufficiently drying the coating.

DESCRIPTION OF PREFERRED EMBODIMENTS

Generally, the present invention includes following preferred embodiments. The deflecting and heating roller may be a roller which inverts a traveling direction of the web and which has its movement adjusted in parallel with the traveling direction of the web.

The deflecting and heating roller may be a roller which is varied in its position in a parallel direction with the direction in which the web travels toward said deflecting and heating roller, and the web travels away from the deflecting and heating roller traveling in a direction at an angle with the parallel direction.

Generally, the gas-flow supply means is extended along the traveling direction of the web.

The drying chamber may comprise a first drying zone and a second drying zone, and said deflecting and heating roller is preferably disposed in the second drying zone.

The drying chamber may further comprise gas flow supply means for supplying a gas flow toward the coating of the web within a traveling region of the web after deflection at the deflecting and heating roller.

More specifically, the present invention provides an apparatus for continuously drying a coating on a web, comprising:

a drying chamber having first and second drying zones disposed subsequently through which the web travels continuously;

gas-flow supply means for supplying gas flow to the coating of the web traveling in said drying chamber, said gas-flow supply means comprises first and second gas-flow supply zones associated with the first and second drying zones;

a deflecting and heating roller, disposed in association with at least the second drying zone, for deflecting the web in said drying chamber, said deflecting and heating roller being variable in position for deflecting the web so that a length of the web to reside in said drying chamber is capable of being variably adjusted;

roller means, associated with the deflecting and heating roller, for guiding the web so as to travel in parallel directions toward and away from the deflecting and heating roller; and means for changing the position of the deflecting and heating roller in a direction parallel to the traveling direction of the web.

In this specific apparatus, the drying chamber may further include a third drying zone subsequent to the second drying zone downstream of the deflecting and heating roller. The deflecting and heating roller may be with its position variably disposed in the second drying zone such that a residence period of time of the web in the second drying zone varies with the varied position of the deflecting and heating roller. The second and third drying zones include air guide nozzles extending along the web and being directed to the coating of the web.

The third drying zone may be disposed such that the residence period of time of the web varies with the varied position of the deflecting and heating roller. The deflecting and heating roller preferably deflects the web contacting a back surface of the strip.

Figure 1:
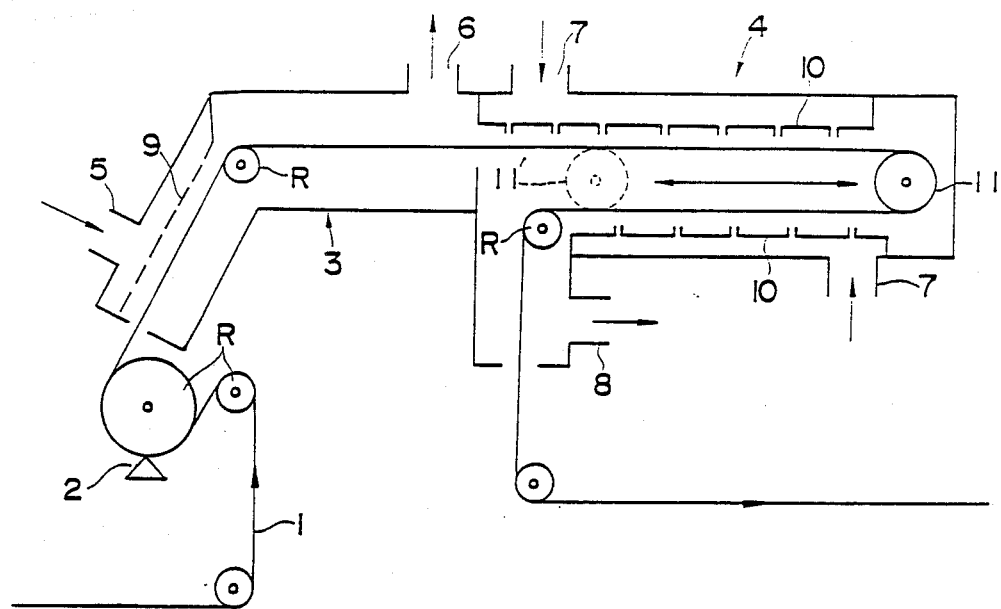
FIG. 1 is a schematic sectional view showing an example of a drying apparatus according to the present invention.
Figure 2:
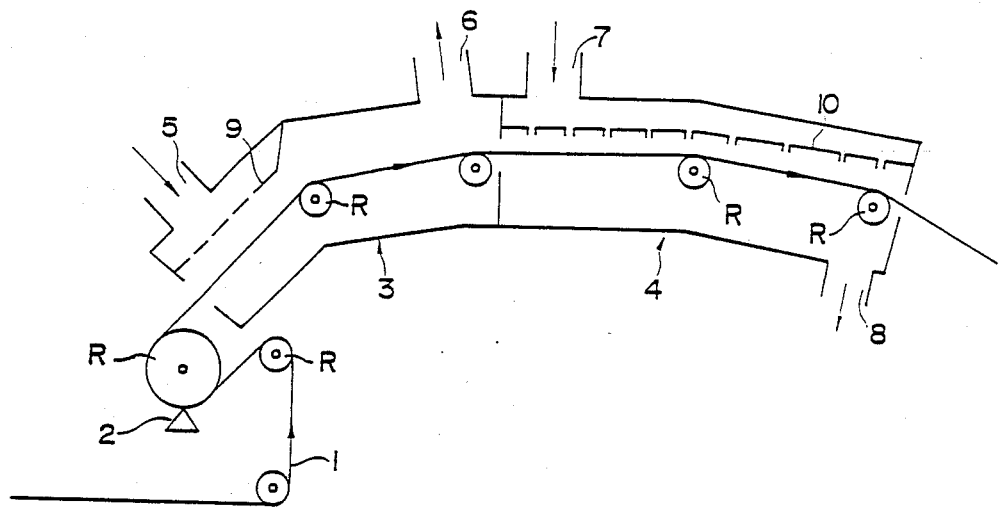
FIG. 2 is a schematic sectional view showing a drying apparatus according to the prior art.

The construction of the apparatus according to an embodiment of the present invention will now be described in more detail with reference to the drawings. Shown in FIG. 1 is a schematic sectional view of an example of the drying apparatus of the invention. As shown in FIG. 1, the apparatus of the invention uses an aluminum web 1 as an web to be treated and includes a deflecting and heating roller 11 as a roller member, a first subordinate-step drying zone 3 and a second subordinate-step drying zone 4 both forming a drying chamber, and a straightening vane 9 and slit-type nozzles 10 as gas-flow supply means.

More specifically, the apparatus of an embodiment of the present invention is an apparatus for continuously drying a coating on a web, comprising a drying chamber 3, 4, a roller 11 which deflects the web 1 having the coating and traveling continuously in the drying chamber 3, 4, and which is constructed as a heating roller, the deflecting and heating roller 11 being variable in position for deflecting the web 1 so that a length (i.e., residence period of time) of the web to stay in the drying chamber 3, 4 may be variably adjusted, and gas-flow supply means 9, 10 for supplying gas flows to the coating of the web 1 traveling in the drying chamber 3, 4.

The aluminum web 1 which travels continuously while being guided by cylindrical guide rollers R is formed to have a coating in such a manner that its surface confronting an applicator is coated with a photosensitive resin containing an organic solvent by the applicator 2. The web 1 is introduced into the first subordinate-step drying zone 3. The photosensitive resin containing the organic solvent is a liquid which contains the solvent. The first-subordinate drying zone 3 is provided with a gas inlet 5 and a gas outlet 6. A gas supplied through the gas inlet 5 is distributed into uniformly distributed gas flows by the distributing vane 9 which is extended along the traveling direction of the aluminum web 1 at a distance therefrom. The gas flows come into contact with the coating of the aluminum web 1, for instance, at a rate of 50-100 m³/min for a 1 m-width of the aluminum web 1 and vaporize the organic solvent, whereupon the gas containing evaporated solvent is discharged through the gas outlet 6. In a case with the organic resin coating with solvent in order to avoid the orange peel defect, the temperature of the gas flows is controlled to the optimum value of 50°-80° C. The coating of the aluminum web 1 reaching the vicinity of the exit of the first-subordinate drying zone 3 changes into a soft film state because about 80% of the organic solvent contained in the coating step has been vaporized away. In the first-subordinate drying zone 3, therefore, the control of the concentration of an organic solvent gas in the drying gas is especially important from the viewpoint of the danger of explosion.

Subsequently, the aluminum web 1 which travels continuously while being guided by the cylindrical guide rollers R is introduced into the second-subordinate drying zone 4. This drying zone 4 is provided with gas inlet 7 and a gas outlet 8. A high-temperature gas supplied through the gas inlet 7 is expelled as gas flows from the slit type nozzles 10 which are extended along the traveling direction of the aluminum web 1. The gas flows come into contact with the coating surface of the aluminum web 1, supply the aluminum web 1 with heat energy and vaporize the organic solvent remaining in the coating, whereupon they are discharged through the gas outlet 8. The aluminum web 1 is contacted by the hot gas flows, for instance, at a rate of 50-100 m³/min for its width of 1 m, and the temperature of the hot gas flows is controlled to 100°-120° C. The coefficient of heat transfer from the high-temperature gas flows to the aluminum web 1 is 50-100 kcal/m² Hr °C.

The deflecting and heating roller 11 in the shape of a cylinder, which is controlled to 100°-120° C., is capable of rotating about the axis of the cylinder and is held in contact with the aluminum web 1 traveling continuously. Thus, it deflects and inverts the traveling direction of the aluminum web 1 and simultaneously heats the aluminum web 1 through contact with the reverse surface of the web 1 to supply it with heat energy and to vaporize the organic solvent remaining in the coating. The coefficient of heat transfer from the deflecting and heating roller 11 to the aluminum web 1 is 100,000-200,000 kcal/m² Hr °C in a case where this roller has a diameter of 600 mm and where the aluminum web has a thickness of 0.5 mm. Owing to the installation of the deflecting and heating roller 11, the efficiency of the heat transfer to the aluminum web 1 can be greatly enhanced. A heated steam is ordinarily usable as the heat source of the deflecting and heating roller 11, but a heater or the like whose temperature is adjustable can also be employed.

The amount of the organic solvent remaining in the coating of the aluminum web 1 reaching the vicinity of the exit of the second subordinate-step drying zone 4 becomes 1-5%, and the coating turns into a hard film layer.

In addition, since the deflecting and heating roller 11 has its bearing part mounted on a slide bearing, it can move in parallel with the traveling direction of the aluminum web 1. Moreover, since the deflecting and heating roller 11 inverts the traveling direction of the aluminum web 1 by 180° as stated before, the increment or decrement of the length of the web to stay in the drying chamber, versus the moving distance of the deflecting and heating roller 11, is maximized. The deflecting and heating roller 11 is adapted to move to any desired position within limits, for example, from a position indicated at numeral 11 by the solid lines to a position indicated at numeral 11' by the broken lines. By fixing the rotary shaft of the deflecting and heating roller at the desired position, the second subordinate drying zone 4 can be, in effect, be contracted or expanded momentarily. Accordingly, in case of a change in drying conditions attendant upon a change in the kind of article to be dried, the drying conditions can be instantly changed by contracting or expanding the second subordinate drying zone 4 on the basis of a change in the position of the deflecting and heating roller 11, and the amount of the solvent to be left in the coating of the web can be controlled as desired.

Figure 3:
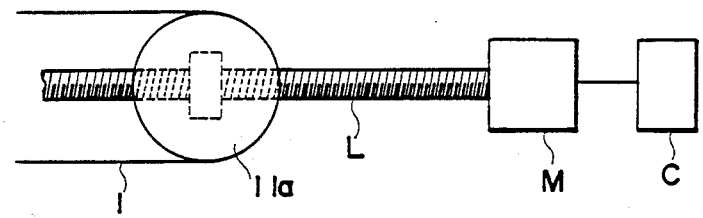
FIG. 3 is a plan view showing the olutline of means for moving a deflecting and heating roller.

The means for moving the deflecting and heating roller 11 is not restricted to the aforementioned means employing the slide bearing. Another means is shown in FIG. 3. A stepping motor M is controlled by a controller C so as to rotate a threaded rod L. Depending upon the rotating direction of the threaded rod L, a deflecting and heating roller 11a can be freely moved rightwards or leftwards along the threaded rod L. Moreover, the deflecting and heating roller 11a has a built-in temperature-regulatable heater and can be regulated to any desired temperature. Therefore, it is capable of freely controlling the drying conditions of the apparatus, whereby any of various kinds of coatings applied to web can be dried to a desired state.

The sag of the aluminum web attributed to the change in the position of the deflecting and heating roller 11 is absorbed by a sag-absorbing reserve roller (conventional one and not shown) which is installed behind the second-subordinate drying zone 4.

It is to be understood that the drying apparatus of the present invention is not restricted to the foregoing examples, and that the present invention is applicable to drying apparatus in general for layers formed on a web traveling continuously.

The deflecting and heating roller functions to invert the traveling direction of the web. It is accordingly desirable that this roller have its movement adjusted in parallel with the traveling direction of the web, and that the gas-flow supply means be extended in the traveling direction of the web.

The coating layer of the web can be formed on the web by any of various expedients such as air-spray coating and airless-spray coating.

The roller for deflecting the web is disposed so as to be capable of varying its position for deflecting the web so that the length of the web to stay in the drying chamber can be variably adjusted, whereby the residence period of time of the web in the drying chamber can be lengthened or shortened when the traveling speed of the web is constant.

Owing to the provision of the gas-flow supply means for supplying the gas flows to the coating of the web which travels in the drying chamber, the rate of the supply of the gas flows to the coating is raised or lowered in response to the increase or decrease in the length of the web that stays in the drying chamber. Thus, the dried state of the coating of the web can be freely controlled. In the case where the coating contains the solvent, the amount of the solvent to remain in the coating can be freely controlled.

Moreover, the deflecting and heating roller directly heats the web in deflecting it, so that the coating can be dried more quickly than in the case where drying is based solely on gas flows. In effect, therefore, the drying chamber can be enlarged. One or more such deflecting and heating rollers can be disposed in the drying chamber.

Figure 4:
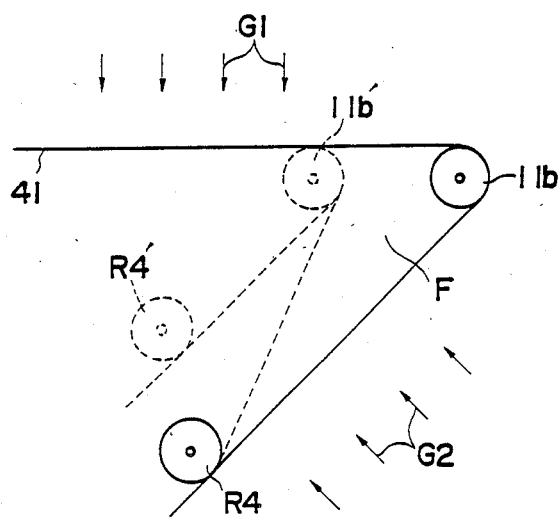
FIG. 4 is a schematic plan view showing an example of a change in the length of a web that is to stay in a drying chamber.

Regarding the alteration in the length of the web to stay in the drying chamber, the foregoing aspect of the alteration illustrated in FIG. 1 can change to the utmost the increment or decrement of the length of the web to stay in the drying chamber, versus the moving distance of the deflecting and heating roller, but it is no way restrictive. Another example is illustrated in FIG. 4. A deflecting and heating roller 11b deflects a web 41 which travels continuously. A coating on the web 41 is uniformly supplied with gas flows G1 and G2. When the deflecting and heating roller 11b is moved so as to be disposed within a region F partitioned by the web 41, the length of the web to stay in the drying chamber can be decreased. By way of example, the length of the web to stay in the drying chamber can be decreased by moving the deflecting and heating roller 11b to a position 11b'. In this case, in order to uniformly supply the gas flows to the coating of the web, the gas flows G2 can be directed perpendicular to the coating. Here the web 41 can be located perpendicular to the gas flows G2 by moving a guide roller R4 for this web 41 to a position R4'. Moreover, the state of the gas flow supply before the decrease in the length of the web to stay in the drying chamber can be restored by, for example, raising the wind velocity of the gas flows G2 or bringing the supply position of the gas flows G2 closer to the coating. The length of the web to stay in the drying chamber can also be increased by reversing the above procedure.

As many apparently widely different embodiments of the present invention can be made without departing from the spirit and scope thereof, it is to be understood that the invention is not limited to the specific embodiments thereof except as defined in the appended claims.

What is claimed is:

1. An apparatus for continuously drying a coating layer on a web, comprising:
    a drying chamber;
    a deflecting and heating roller for deflecting the web which has the coating layer and which travels continuously in said drying chamber, said deflecting and heating roller being variable in position for deflecting the web so that a length of the web to reside in said drying chamber is capable of being variably adjusted; and
    gas-flow supply means for supplying gas flow to the coating of the web traveling in said drying chamber.

2. The apparatus as defined in claim 1, wherein said deflecting and heating roller is a roller which inverts a traveling direction of the web and which has its movement adjusted in parallel with the traveling direction of the web.

3. The apparatus as defined in claim 1, wherein said gas-flow supply means is extended along the traveling direction of the web.

4. The apparatus as defined in claim 1, wherein said deflecting and heating roller is a roller which is varied in its position in a parallel direction with the direction in which the web travels toward said deflecting and heating roller, and the web travels away from the deflecting and heating roller traveling in a direction at an angle with the parallel direction.

5. The apparatus as defined in claim 1, wherein the drying chamber comprises a first drying zone and a second drying zone, and said deflecting and heating roller is disposed in the second drying zone.

6. The apparatus as defined in claim 1, wherein the drying chamber further comprises gas flow supply means for supplying a gas flow toward the coating of the web within a traveling region of the web after deflection at the deflecting and heating roller.

7. An apparatus for continuously drying a coating layer on a web, comprising:
    a drying chamber having first and second drying zones disposed subsequently through which the web travels continuously;
    gas-flow supply means for supplying gas flow to the coating of the web traveling in said drying chamber, said gas-flow supply means comprises first and second gas-flow supply zones associated with the first and second drying zones;
    a deflecting and heating roller, disposed in association with at least the second drying zone, for deflecting the web in said drying chamber, said deflecting and heating roller being variable in position for deflecting the web so that a length of the web to reside in said drying chamber is capable of being variably adjusted;
    roller means, associated with the deflecting and heating roller, for guiding the web so as to travel in parallel directions toward and away from the deflecting and heating roller; and
    means for changing the position of the deflecting and heating roller in a direction parallel to the traveling direction of the web.

8. The apparatus as defined in claim 7, wherein said drying chamber further includes a third drying zone subsequent to the second drying zone downstream of the deflecting and heating roller.

9. The apparatus as defined in claim 7, wherein the deflecting and heating roller is with its position variably disposed in the second drying zone such that a residence period of time of the web in the second drying zone varies with the varied position of the deflecting and heating roller.

10. The apparatus as defined in claim 8, wherein said second and third drying zones include air guide nozzles extending along the web and being directed to the coating of the web.

11. The apparatus as defined in claim 8, wherein the third drying zone is disposed such that the residence period of time of the web varies with the varied position of the deflecting and heating roller.

12. The apparatus as defined in claim 7, wherein said deflecting and heating roller deflects the web contacting a back surface of the web.

* * * * *